United States Patent
Maheshwari et al.

(10) Patent No.: US 7,205,797 B1
(45) Date of Patent: Apr. 17, 2007

(54) COMMON MODE DETECTION AND DYNAMIC CORRECTION INPUT CIRCUIT

(75) Inventors: Sanjeev K. Maheshwari, San Jose, CA (US); Babak Taheri, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/852,954

(22) Filed: May 24, 2004

Related U.S. Application Data

(60) Provisional application No. 60/483,421, filed on Jun. 28, 2003.

(51) Int. Cl.
*H03K 5/153* (2006.01)

(52) U.S. Cl. .......................... 327/72; 327/73

(58) Field of Classification Search ............... 327/72, 327/73; 330/258
See application file for complete search history.

(56) References Cited

U.S. PATENT DOCUMENTS

| | | | | |
|---|---|---|---|---|
| 4,276,539 A * | 6/1981 | Eshraghian et al. | ........ | 340/939 |
| 4,345,213 A | 8/1982 | Schade, Jr. | | |
| 4,463,272 A * | 7/1984 | Tucker | .......... | 327/14 |
| 4,571,514 A * | 2/1986 | Nelson et al. | ................. | 327/33 |
| 4,734,677 A * | 3/1988 | Cake et al. | ................. | 341/122 |
| 5,475,323 A | 12/1995 | Harris et al. | | |
| 5,760,844 A * | 6/1998 | Jorden | .......................... | 348/691 |
| 5,831,457 A | 11/1998 | McClure | | |
| 5,856,750 A * | 1/1999 | Koseki | ............ | 327/72 |
| 5,909,143 A * | 6/1999 | Weber | ........... | 327/551 |
| 5,945,864 A * | 8/1999 | Weber et al. | ................ | 327/307 |
| 5,969,547 A * | 10/1999 | Pernyeszi | ...................... | 327/73 |
| 5,994,927 A * | 11/1999 | Naito et al. | ..................... | 327/72 |
| 6,392,450 B2 * | 5/2002 | Yoshida et al. | ................ | 327/72 |
| 6,411,165 B1 | 6/2002 | Delano | | |
| 6,690,309 B1 | 2/2004 | James et al. | | |
| 6,694,105 B2 * | 2/2004 | Chang et al. | ................ | 398/202 |
| 2003/0039320 A1 * | 2/2003 | Christoph et al. | .......... | 375/317 |

OTHER PUBLICATIONS

EIA/JEDEC STANDARD No. 8-6: High Speed Transceiver Logic (HSTL) A 1.5 V Output Buffer Supply Voltage Based Interface Standard for Digital Integrated Circuits Aug. 1995.

* cited by examiner

*Primary Examiner*—Kenneth B. Wells
(74) *Attorney, Agent, or Firm*—Bradley T. Sako

(57) ABSTRACT

A single ended input circuit can receive an input signal and generate a correction voltage corresponding to a common mode voltage of the input signal. A comparison of the input signal can be adjusted in response to the correction voltage. In one arrangement, an input circuit (100) can include a compare section (102) with first input (104-0) and second input (104-1). The first input (104-0) can receive an input signal (IN). The second input (104-1) can receive a reference voltage generated by a common mode detect and hold (CMDH) section (106). A (CMDH) section (106) can include an integrator circuit (108), an analog-to-digital (A/D) converter circuit (110), a digital hold circuit (112), and a digital-to-analog (D/A) converter (114). A correction voltage generated by integrating the input signal can be applied as the generated reference voltage. In another arrangement, a voltage (CLKP-CLKN) generated by comparing an input signal (CLK) to an applied reference voltage (REF) can be integrated by an integrator (202) to generate a correction voltage. Such a correction can be applied as negative feedback to adjust the comparison between the input signal (CLK) to an applied reference voltage (REF). This correction voltage can also be applied to adjust the comparison of an input data signal to a reference voltage.

8 Claims, 6 Drawing Sheets

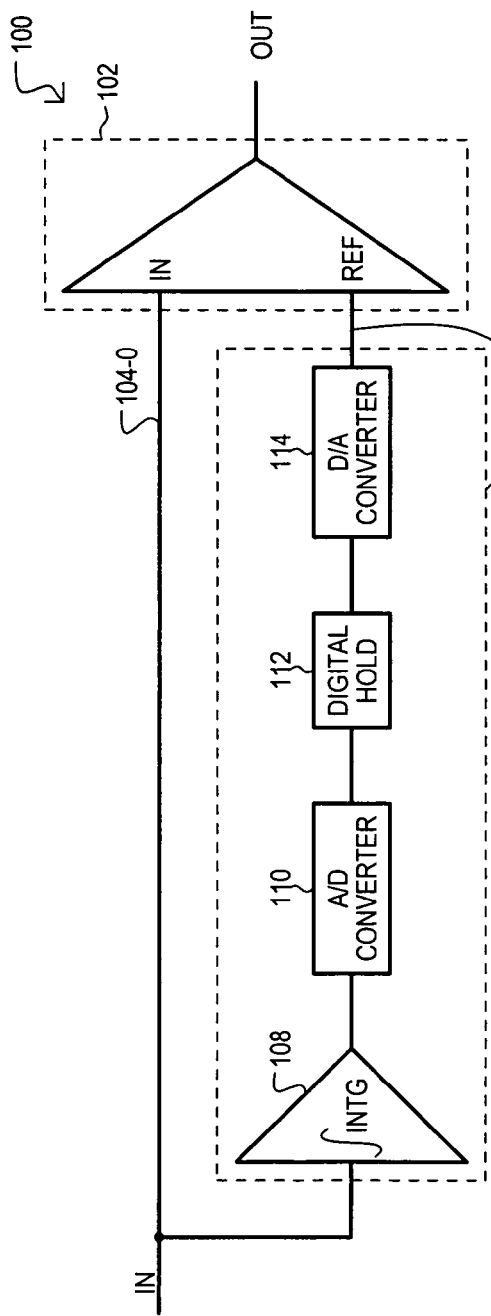
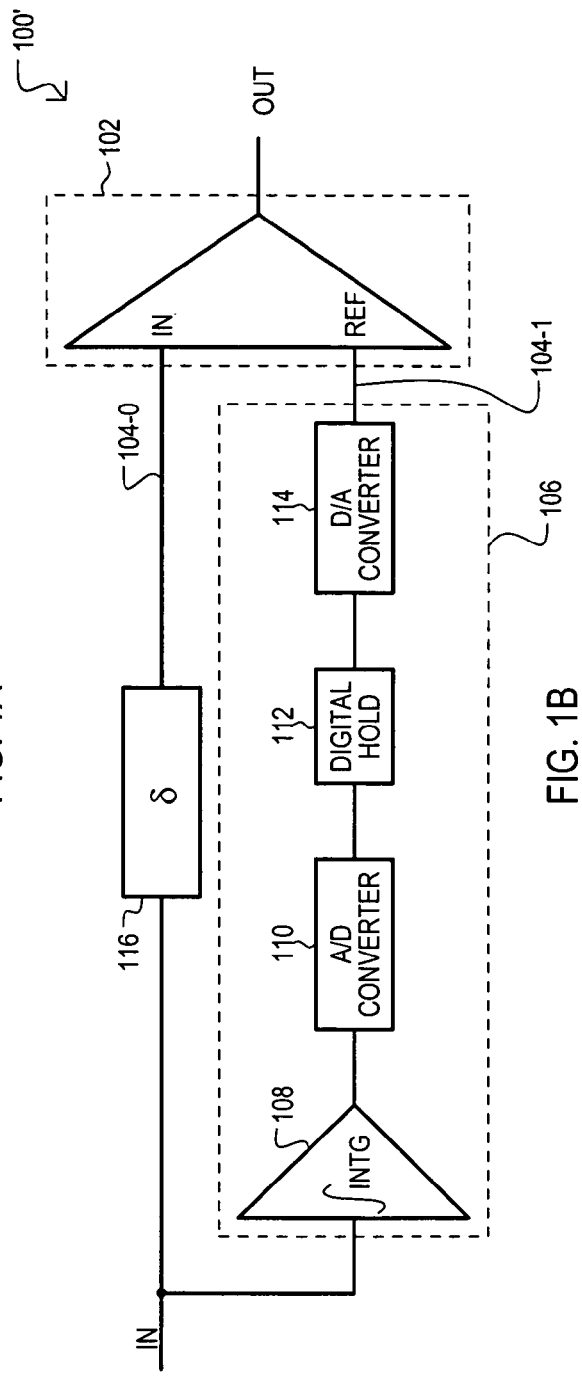
FIG. 1A
FIG. 1B

COMMON MODE DETECTION AND DYNAMIC CORRECTION INPUT CIRCUIT

This application claims the benefit of U.S. Provisional Patent Application Ser. No. 60/483,421 filed on Jun. 28, 2003.

TECHNICAL FIELD

The present invention relates generally to input circuits, and more particularly to input circuits that receive input signals that can include a common mode voltage.

BACKGROUND OF THE INVENTION

It remains a continuing goal of integrated circuits and electronic systems to provide rapid communication between devices. At the same time, it is desirable that communication signals maintain a certain degree of integrity. As data transmission speeds increase, transmission line effects, and the like can affect signal quality.

As is well known, various forms of signal termination can address transmission line effects and thus improve signal integrity. For example, some circuit boards can include termination resistors to match a predetermined characteristic impedance of a signal line, or otherwise reduce signal reflection. A drawback to such approaches can be the increased component count in a resulting circuit board. This can increase overall device cost and/or size.

Conventionally, one approach to addressing the above drawback can be to include termination impedance on an integrated circuit device itself. Such on-die-termination (ODT) can eliminate the need for external board termination devices.

An input circuit of an integrated circuit device typically includes a compare circuit that compares a signal potential/current to some other value. While some approaches can include differential compare circuits that receive complementary signals, such approaches are undesirable as two signal lines are required per input value. To reduce signal line count, input circuits can be "single ended referential inputs." Single ended referential input circuits can receive an input signal on one signal line, and compare the voltage/current of the input signal to a corresponding reference voltage/current. In many cases, the reference voltage/current can be generated "on-chip" (e.g., on the integrated circuit device).

One example of a conventional single ended referential input circuit is set forth in FIG. 7A and designated by the general reference character 700. FIG. 7A shows an input circuit with a conventional comparator arrangement. In particular, differences in potential between an input signal IN and a reference voltage REF are detected by differential transistor pair N70 and N71. Such a difference is amplified by a differential amplifier stage that includes differential pair N73 and N74 and current mirror P70/P71. It is understood that the conventional circuit of FIG. 7A could be subject to some variation. While the input stage shown is an NMOS type input stage, such an input stage could include a PMOS input stage. Further, the differential amplifier stage may include a current source or the like between the common source connections of differential pair N73/N74 and ground. The circuit set forth in FIG. 7A can comply with the high speed transceiver logic (HSTL) standard set forth in EIA/JEDEC Standard JESD8-6.

On-die-termination (ODT) can reduce component cost and board size. Unfortunately the termination impedance in ODT arrangements can vary. This can be due to uncontrollable process variation, or the like. Such variation in ODT impedance can translate into corresponding variations in a signal common mode voltage. As but one very particular example, in an HSTL case, a signal common mode voltage variation can be as large ±65 mV with respect to a reference voltage, as compared to actual signal swing, which can be 300 mV. More particularly, signal common mode variation can be as large as ±40 mV with a ±25 mV variation in reference voltage, for an overall variation of ±65 mV. This will be referred herein as signal common mode variation or signal offset from reference voltage.

Signal common mode voltage variations can lead to undesirable jitter in signal reception response. More particularly, some input/output signaling conventions can impose relatively slow signal rise rates (e.g., 1V/ns) at a system level. Such low signal rise rates can contribute to high jitter (e.g., 130 ps) as a signal sampling point varies with respect to the varying signal common mode voltage, as shown in FIG. 7B. Consequently, this can distort the pulse width/duty cycle of an output signal provided by the input circuit, translating into overall jitter and reduction in overall timing budget.

The above drawbacks to a conventional approach like that of FIG. 7A are shown in more detail in a timing diagram of FIG. 7B.

FIG. 7B is a timing diagram that shows a reference voltage REF with respect to three input signals (IN0 to IN2) having increasingly larger common mode voltages. As is shown by the timing diagram, the point at which a logic high is detected (e.g., point in time at which the signal level exceeds REF or falls below REF) can vary considerably according to signal common mode voltage. This can lead to pulse width distortion of an output signal generated by an input circuit.

While the HSTL standard has been described as one type of signaling that may utilize single ended input configuration, other known signaling conventions are known that may include single ended signaling. Such other signaling conventions may suffer from some or all of the above drawbacks. Example of other signaling conventions include, but are not limited to: low voltage positive emitter coupled logic (LVPECL), low voltage differential logic (LVDS), current mode logic (CML), and gunning transistor logic (GTL), to name just a few.

In light of the above, it would be desirable to arrive at a single ended referential input arrangement that can be less susceptible to signal common mode voltage variation than the conventional approaches described above.

SUMMARY OF THE INVENTION

The present invention can include an input circuit having a common mode detect and hold section (CMDH) and a compare circuit. The CMDH section can receive an input signal on an input signal line to generate a reference voltage that includes a signal common mode voltage of the input signal. The compare circuit can compare the potential on the input signal line to the generated reference voltage to generate an output signal.

In such an arrangement, a generated reference voltage can be a signal common mode voltage, essentially reducing uncertainty in a sampling point for the input signal.

According to one aspect of the embodiments, a CMDH section can include a detect circuit that receives the input signal and generates an output voltage. The detect circuit may be an integrator circuit and/or signal level averaging circuit.

An integrator/signal averaging circuit can accurately extract a common mode of a swinging input signal.

According to another aspect of the embodiments, a CMDH section can further include an analog-to-digital (A/D) converter for converting an analog output voltage of the detect circuit into a digital value.

According to another aspect of the embodiments, a CMDH section can further include a digital-to-analog converter for converting the digital value from the (A/D) converter into the generated reference voltage.

According to another aspect of the embodiments, a CMDH section can further include a digital hold circuit that includes storage circuits for storing the digital value.

In this way, an integrated voltage can be captured digitally, and thus easily stored and retrieved for use.

According to another aspect of the embodiments, the input circuit can include a plurality of N input pins and N compare circuits (e.g., one compare circuit for each input pin). The input circuit may also include N CMDH sections, each CMDH section providing a generated reference voltage that includes a corresponding extracted signal common mode voltage to one of the N corresponding compare circuits.

By providing such generated reference voltages on a one-to-one basis with respect to input pins, the input circuit may provide accurate input signal sampling in environments where common mode voltage can vary considerably across multiple input lines.

According to another aspect of the embodiments, the reference voltage generated by the at least one CMDH section can be provided as an output voltage from one integrated circuit device to another integrated circuit device.

In this way, a CMDH section may be advantageously utilized by multiple integrated circuit devices. This can provide the benefit of such a circuit without having to include such a circuit on the other integrated circuit device.

According to another aspect of the embodiments, the input circuit can include a plurality of N input pins and N compare circuits, one for each input pin. The input circuit may also include M CMDH sections. At least one of the CMDH sections can provide a generated reference voltage that includes a corresponding signal common mode voltage to a plurality of the compare circuits.

In such an arrangement, a single generated reference voltage can be shared among inputs, leading to less die area. Such an arrangement may be particularly suited for environments in which a signal common mode voltage can vary little across multiple input lines.

The present invention may also include an input circuit that includes a compare circuit that compares an input signal value to an applied reference voltage to generate an output signal on at least one output node. The input circuit also includes a signal offset correction section that generates an offset correction voltage from the at least one output node. Further, a feedback circuit can alter the output node potential in response to the offset correction voltage.

In such an arrangement the compare operation between the input signal value and applied reference voltage can be adjusted according to an offset correction voltage, to thereby correct for input signal common mode offset from the applied reference voltage.

According to one aspect of the embodiments, a compare circuit can include a first transistor and second transistor arranged as a differential pair as well as a first output node and a second output node. In addition, a feedback circuit can include a first feedback transistor having a control terminal coupled to the offset correction section and a current path terminal coupled to the first output node. According to another aspect of the embodiments, at least one feedback circuit can further include a second feedback transistor having a control terminal coupled to the offset correction section and a current path terminal coupled to the second output node.

According to another aspect of the embodiments, an offset correction section can comprise an integrator circuit that generates an offset correction voltage having an inverted or inverse-like relationship to the at least one output node voltage.

According to another aspect of the embodiments, a compare circuit can include a plurality of compare circuits that each compares a particular input signal to the applied reference voltage. In addition, at least one offset correction section provides the offset correction voltage to a plurality of the compare circuits.

According to another aspect of the embodiments, one of a plurality of compare circuits can be a clock compare circuit that compares a periodic clock signal to the applied reference voltage. In addition, at least one offset correction section can generate an offset correction voltage from the at least one output node of clock compare circuit, and provide the offset correction voltage to the plurality of compare circuits. In this way, an input signal with periodic transitions (e.g., clock signal) can be utilized to generate an offset correction voltage for compensating for the signal common mode voltage offset of one or more other signals.

According to another aspect of the embodiments, the input circuit may further include an output circuit coupled to an output node that amplifies the output signal.

The present invention may also include a method for determining single ended input signal values. The method can include receiving one of the input signals to generate a correction voltage corresponding to a signal common mode voltage of the one input signal, and adjusting the comparison of a first input signal in response to the correction voltage.

According to one aspect of the embodiments, the step of receiving one of the input signals can include integrating the one input signal voltage to generate an integrator output voltage that includes the signal common mode voltage of the one input signal. In addition, the step of adjusting the comparison of the first input signal in response to the correction voltage can include applying the correction voltage as a generated reference voltage.

According to another aspect of the embodiments, the step of adjusting the comparison of the first input signal further includes converting the integrator output voltage to a digital value, storing the digital value, and converting the digital value as the generated reference voltage.

According to another aspect of the embodiments, the step of receiving the one input signal can include receiving an output voltage at output nodes that is generated by a differential comparison between an applied reference voltage and the one input signal, and generating an offset correction voltage therefrom. In addition, the step of adjusting the comparison of the first input signal in response to the correction voltage can include adjusting impedances between the output nodes and a supply voltage in response to the offset correction voltage.

According to another aspect of the embodiments, the one input signal is different than the first input signal.

According to another aspect of the embodiments, the step of adjusting the comparison of the first input signal includes adjusting the comparison of a plurality of input signals to a generated reference voltage generated from the offset voltage.

BRIEF DESCRIPTION OF THE DRAWINGS

FIG. 1A is a block diagram schematic diagram of an input circuit according to a first embodiment of the present invention. FIG. 1B is a block diagram schematic diagram of an input circuit according to one variation of the first embodiment.

DETAILED DESCRIPTION

Figure 2:
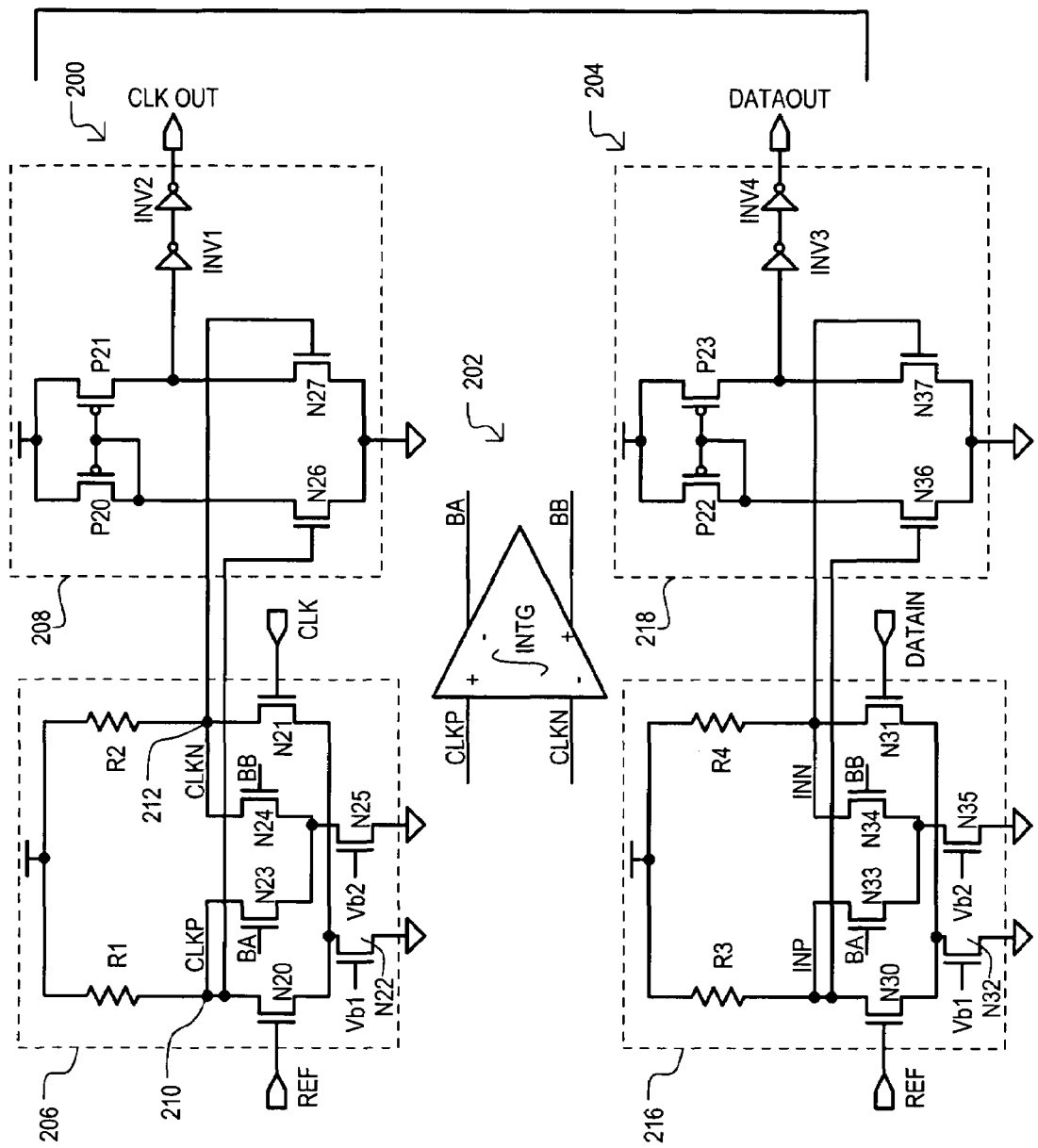
FIG. 2 is a schematic diagram of an input circuit according to a second embodiment of the present invention.

Various embodiments of the present invention will now be described in detail with reference to a number of drawings. The embodiments include single ended input circuits that can receive an input signal and provide an output signal corresponding to a logic value of the input signal.

Referring now to FIG. 1A, a first embodiment of the present invention is an input circuit shown in a block schematic diagram and designated by the general reference character 100. An input circuit 100 can include a compare section 102 that includes a first input 104-0 that receives an input signal IN and a second input connected to a common mode detect and hold section 106. A compare section 102 can generate an output signal OUT according to a difference between signals received at inputs 104-0 and 104-1.

A common mode detect and hold (CMDH) section 106 can provide a generated reference voltage that essentially includes a common mode voltage of an input signal IN. Thus, a generated reference voltage provided at input 104-1 can include an "extracted" signal common mode voltage.

It is understood that a CMDH section 106 may be physically situated in different section of an integrated circuit device (e.g., periphery versus core), according to the particular application. For example, a CMDH section 106 may be implemented with a circuit that can include anywhere from ten to hundreds of transistors, according to desired precision, common mode voltage characteristics, etc. For larger transistor count implementations, such a circuit block could be situated in the core of an integrated circuit device. Conversely, smaller transistor count implementations could be situated in the periphery of an integrated circuit device.

In the particular example of FIG. 1A, a CMDH section 106 can include an integrator circuit 108, an analog-to-digital (A/D) converter circuit 110, a digital hold circuit 112, and a digital-to-analog (D/A) converter 114. An integrator circuit 108 can integrate or average an incoming signal value. After a predetermined time period, integrator circuit 108 can output a voltage that includes any signal common mode voltage of an input signal IN swing. Such an output voltage can be provided to an A/D converter 110.

An A/D converter 110 can convert the integrated or averaged signal from integrated circuit into a digital value. Such a digital value can be output to a digital hold circuit 112 which can store the value. A digital hold circuit 112 can output a stored digital value, representative of the integrated (or averaged) signal value, to a D/A converter 114.

A D/A converter 114 can convert the stored value from digital hold circuit 112 into a generated reference voltage that is applied to input 104-1. As noted above, an input signal IN can be compared to such a generated reference voltage REF to generate an output value.

In this way, an incoming input signal IN can be sampled against its own signal common mode voltage, thus removing uncertainty that may arise when a reference voltage is generated independent of a signal common mode voltage. As a result, an output signal OUT may have an improved signal quality, as distortion due to sampling uncertainty can be removed or otherwise suppressed.

It is understood that a CMDH section 106 can detect an input signal at predetermined time periods, continuously, or according to some other arrangement. As a first example, a CMDH section 106 can generate a reference voltage at the beginning of a signaling transaction and then digitize and hold the generated reference for the remainder of the signaling transaction. As a second example, a CMDH section 106 can periodically (e.g., every few microseconds) generate a reference voltage, and hold such a value digitally until the next period. Of course, the present invention could include arrangements other than the above two examples.

FIG. 1B shows one variation of the first embodiment shown in FIG. 1A. FIG. 1B can include some of the same essential components as FIG. 1A, thus a detailed description of such will be omitted. FIG. 1B may also include a delay matching circuit 116. A delay matching circuit 116 may be particularly advantageous in cases where a reference voltage is generated dynamically. A delay matching circuit 116 can delay the application of an input signal IN to compare section 102 by an amount of time essentially equivalent to the amount of time required for the generation of a reference voltage REF by a CMDH 106.

A circuit like that of FIG. 1A or 1B can be connected to the input pin of an integrated circuit in order to provide output signal OUT for further processing within the integrated circuit. While FIGS. 1A and 1B shows an arrangement that can be applied to one pin, it is understood that multiple such circuits can be employed according to operating environment. As a first example, in an environment where a signal common mode voltage may be constant over a range of input lines, the above sampling arrangement can be applied to a few pins, with a resulting generated reference voltage being provided for multiple signals. In environments where more severe signal common mode voltage variation exists, the above sampling arrangement can be applied to every pin. Still further, a circuit like that of FIG. 1A or 1B could provide a generated reference voltage as an output value for one or more other integrated circuits. Such a value may then be utilized as an applied reference voltage for single ended input circuit of such other integrated circuits. Such an arrangement may be particularly advantageous in environments where a signal common mode voltage may be relatively constant over signal lines of an entire system or portion of system.

In this way, a single ended signaling scheme can be essentially self-calibrating, and easily implemented to input circuits that utilize a reference voltage input.

Referring now to FIG. 2, a second embodiment of the present invention is set forth as a block schematic diagram. The example of FIG. 2 shows a first input circuit 200 for one input signal CLK, an integrator circuit 202, and a second input circuit 204 for another input signal DATAIN.

In general, a first input circuit 200 can compare input signal CLK to an applied reference voltage REF. Thus, input signal CLK may include an undesirable signal common mode voltage not included in the applied reference voltage REF. However, such a signal common mode voltage can be compensated for by generating an offset correction voltage from a resulting output signal, and applying such an offset correction value as negative feedback.

More particularly, a first input circuit 200 can include a first input section 206 and a first output section 208. In the particular example of FIG. 2, a first input section 206 can include a first differential transistor pair N20 and N21 having sources commonly coupled to a first current source transistor N22. First current source transistor N22 can be biased according to a first bias voltage Vb1 applied to its gate. Also included are load devices R1 and R2. In the particular example of FIG. 2, load devices R1 and R2 can be resistors connected between a high power supply and the drains of transistors N20 and N21, respectively.

A drain of transistor N20 can provide a first detect output signal CLKP at a node 210. Similarly, a drain of transistor N21 can provide a second detect output signal CLKN at a node 212. Nodes 210 and 212 can be considered output nodes for first input section 206.

Unlike conventional input schemes, a first input section 206 may also include feedback transistors N23 and N24. Feedback transistors N23 and N24 can have sources commonly coupled to a second current source transistor N25. Drains of feedback transistors N23 and N24 can be connected to the drains of transistors N20 and N21, respectively. Feedback transistor N23 can receive a first compensation voltage BA at its gate. Feedback transistor N24 can receive a second compensation voltage BB at its gate. Such compensation voltages will be described in more detail below with reference to integrator circuit 202. Second current source transistor N25 can be biased according to a second bias voltage Vb2 applied to its gate.

As understood from FIG. 2, feedback transistor N23 provides a parallel current path to transistor N20 of the differential pair. Similarly, feedback transistor N24 provides a parallel current path to transistor N21 of the differential pair. In such an arrangement, feedback transistors (N23 and N24) can alter bias levels of the differential pair, thereby changing the point at which the first input section 206 detects a difference between first input signal CLK and an applied reference voltage REF. This will be described in more detail at a later point herein.

A first output section 208 can amplify differences in the potential at output nodes 210 and 212 to generate an output signal CLK OUT. In the particular example of FIG. 2, a first output section 208 can include a first differential transistor pair N26 and N27 having commonly connected sources. Also included is a current mirror circuit formed by transistors P20 and P21. An output section 208 may generate an amplified output signal at the drain—drain connection of transistors P21 and N27. Such an amplified output signal can be buffered by inverters INV1 and INV2 to generate output signal CLK OUT.

As noted above, the embodiment of FIG. 2 can also include integrator circuit 202. An integrator circuit 202 can include a first input "+" connected to node 210 of first input section 206 and a second input "−" connected to node 212 of first input section 206. Integrator circuit 202 can provide an inverted output value BA at an output terminal "−" and an inverted output value BB at an output terminal "+".

Referring still to FIG. 2, it can be seen that integrator output values BA and BB can be applied to gates of feedback transistor N23 and N24, respectively. In such an arrangement, feedback transistors N23 and N24 can provide a negative feedback with respect to a difference in potential between nodes 210 and 212. In such an arrangement, the negative feedback can tend to bias input section 206 to compensate for a signal common mode voltage present on clock input signal CLK.

Like a first input circuit 200, a second input circuit 204 can compare an input signal DATAIN to an applied reference voltage REF. Like signal CLK, signal DATAIN may include the undesirable signal common mode voltage not included in the applied reference voltage REF. As in the case of the first input circuit 200, in the second input circuit 400 the signal common mode voltage can be compensated for by applying an offset correction voltage as negative feedback. However, in the arrangement shown, such negative feedback is generated from the input signal CLK, rather than the input signal DATAIN.

A second input circuit 204 can include a second input section 216 and a second output section 218. In the particular example of FIG. 2, a second input circuit 204 can have the same general structure as a first input circuit 200. Accordingly, a detailed description will be omitted.

A second input circuit 204 can utilize negative voltage feedback signals generated from a CLK signal. Thus, output voltages BA and BB generated from integrator circuit 202 can be applied to gates of feedback transistors N33 and N34, respectively.

In one particular approach, input signal CLK can be a periodic clock signal. Such an arrangement can take advantage of the known periodic state of the clock signal CLK, which can provide a reliable and/or more stable source for generating an offset correction for a signal common mode voltage.

Along these same lines, an offset correction voltage generated by a circuit like that of FIG. 2 (e.g., 200 and 202), could be provided as an offset correction voltage for one or more other integrated circuits. Such a value may then be utilized as an offset correction voltage for single ended input circuit of such other integrated circuits.

A second embodiment, like that of FIG. 2, can provide an input arrangement with a high signal common mode variation tolerance. In particular, such an arrangement may tolerate signal common mode voltage ranges as high as about 22% of an input signal swing. This can reduce jitter considerably. Such results can be achieved when a clock signal CLK (e.g., the signal which is sampled) has signal common mode voltage within the same general range as the other input signal DATAIN. Typically this range can be within 50 mV.

Thus, a second embodiment may be particularly applicable to integrated circuits with on-die-termination (ODT) where very high precision in termination impedance can be difficult to achieve, thus giving rise to undesirably wide variations in signal common mode voltage.

In addition to reducing jitter and duty cycle distortion, the above embodiments may improve delay matching for cases where input signals are received with different signal common mode voltages. By addressing each different signal common mode voltage with an arrangement according to the invention, sampling of input values can occur closer in time. This may be particularly valuable in applications where data input signals are sampled according to a clock input signal. The end result can be set up and hold times that are more relaxed with respect to other conventional input schemes.

Figure 3B:
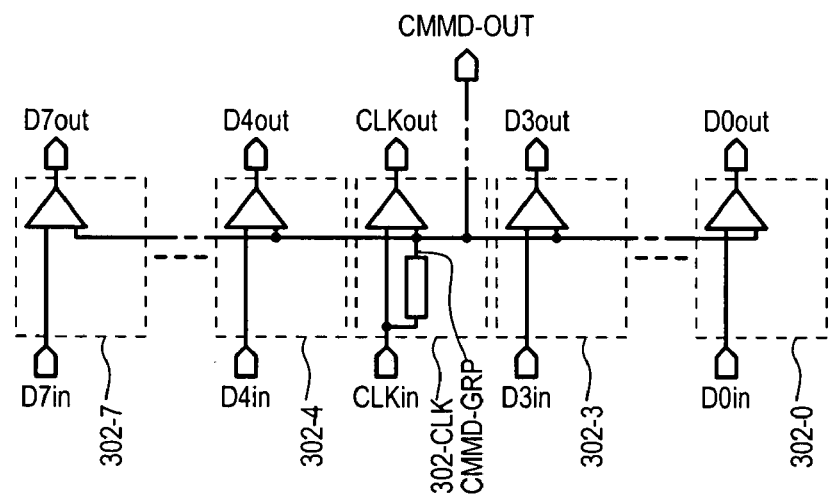
FIG. 3B is a block schematic diagram showing a generated reference voltage shared by multiple inputs.
Figure 3A:
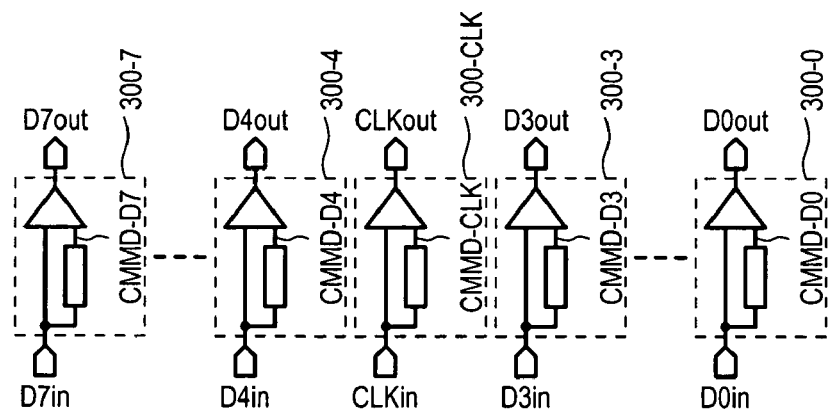
FIG. 3A is a block schematic diagram showing a one-to-one relationship between inputs and generated reference voltages.

FIG. 3A shows one particular embodiment in which generated reference voltages may be generated on a one-to-one basis for each input signal. FIG. 3A shows a number of input circuits 300-0 to 300-7 and 300-CLK. Each input circuit (300-0 to 300-7 and 300-CLK) can receive an input signal and compare such a signal to a reference voltage generated by the circuit. Thus, generated reference voltages CMMD-D7 to CMMD-D0 can be compared to data input signals D7 to D0, respectively, and generated reference voltage CMMD-CLK can be compared to clock input signal CLK.

It is understood, that each of the input circuits (300-0 to 300-7 and 300-CLK) can correspond to FIG. 1A or 1B, for example.

FIG. 3B shows one particular arrangement in which a generated reference voltage can be shared among multiple input signals. Thus, one input circuit 302-CLK can generate a reference voltage for use by multiple other input circuits (302-0 to 302-7). In the particular example of FIG. 3B, a generated reference voltage, referred to herein as CMMD-GRP, can be compared to data input signals D7 to D0 and clock input signal CLK.

It is understood, that each of the input circuit for clock input signal CLK 302-CLK can correspond to FIG. 1A or 1B. The other input circuits for data signals D0 to D7 (302-0 to 302-7) can correspond to FIG. 1A or 1B, but not include a CMDH section. Further, a reference voltage CMMD-GRP can be output as voltage CMMD-OUT to other circuits, such as an entirely different integrated circuit device or another portion of the same integrated circuit device.

Figure 4:
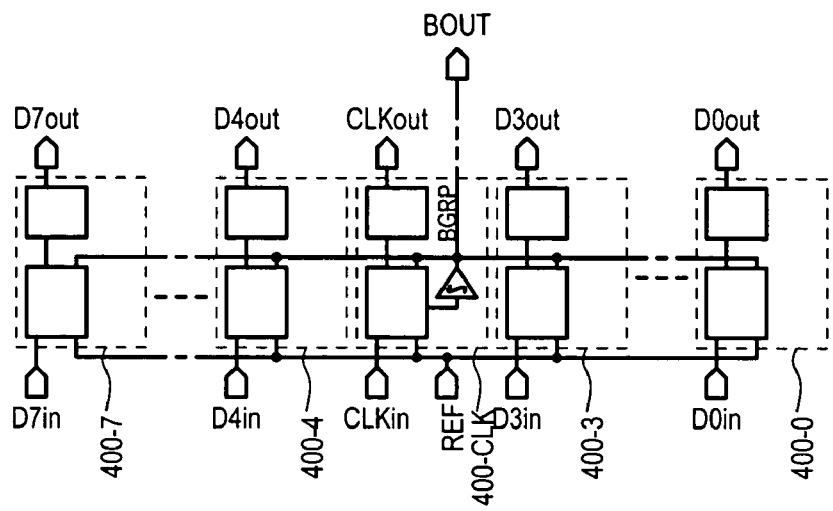
FIG. 4 is a block schematic diagram showing an offset correction voltage shared by multiple inputs.

FIG. 4 shows one particular arrangement in which an offset correction voltage can be shared among multiple input signals. FIG. 4 shows a number of input circuits 400-0 to 400-7 and 400-CLK. One input circuit 400-CLK can generate an offset correction voltage BGRP. Such an offset correction voltage BGRP can be used to bias a comparison between data input signals D7 to D0 and clock input signal CLK with respect to an applied reference voltage REF.

FIG. 4 also illustrates how an offset voltage BGRP can be output as voltage BOUT to other circuits, such as an entirely different integrated circuit device or another portion of the same integrated circuit device. The present invention thus presents a self-calibrating input arrangement, with respect to a signal common mode voltage, that is applicable to single ended signaling. As such, the present invention can be advantageously applied to signaling conventions that may include single ended inputs. Some particularly advantageous applications include high speed transceiver logic (HSTL), low voltage positive emitter coupled logic (LVPECL), low voltage differential logic (LVDS), current mode logic (CML), and gunning transistor logic (GTL). Of course the present invention may be applied to other signaling conventions.

Figure 5C:
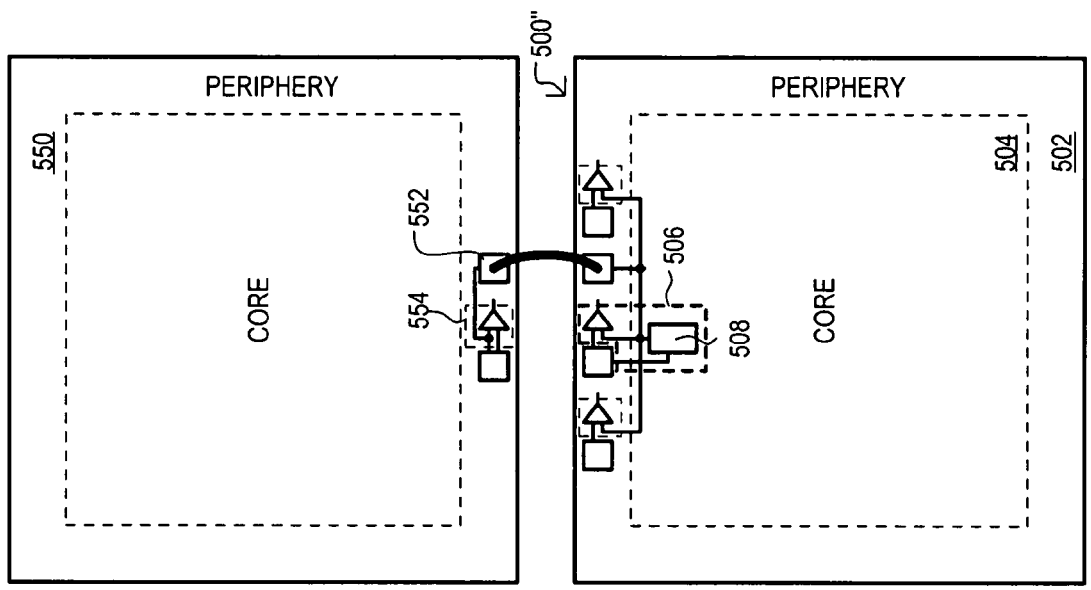
FIGS. 5A to 5C are top plan views of integrated circuits and arrangements according to other embodiments of the present invention.
Figure 5B:
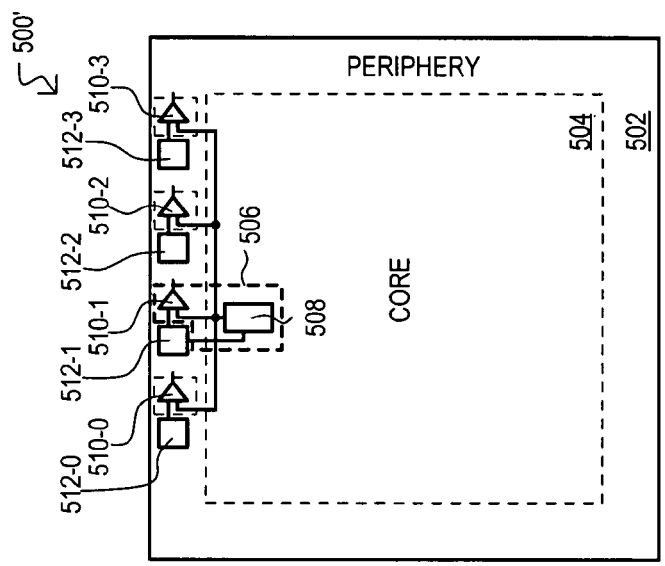
Figure 5A:
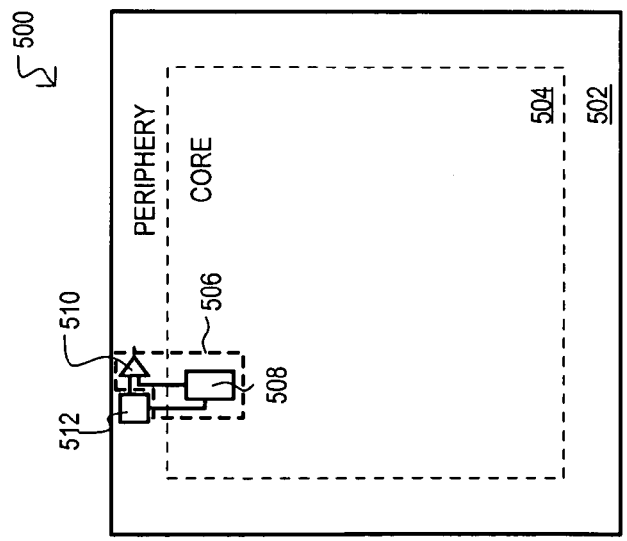

Referring now to FIG. 5A, an integrated circuit according to an embodiment is shown in a top plan view and designated by the general reference character 500. An integrated circuit 500 can include a periphery 502 and a core 504. While FIG. 5A may include numerous other circuit components, only one input section 506 is shown to avoid cluttering the view. An input section can include a integrating section 508 and a compare section 510. An integrating section 508 can include a CMDH section like those shown as 106 in FIGS. 1A/B and/or an integrator circuit like that shown as 202 in FIG. 2. A compare section 510 can include a compare section like that shown as 102 in FIGS. 1A/B and/or input circuits like those shown as 200 or 204 in FIG. 2. An input 512 can provide a signal to the input section 506.

As illustrated in FIG. 5A, at least an integrating section 508 can be situated within a core portion of an integrated circuit 500, to thereby preserve more area in a periphery 502.

Referring now to FIG. 5B, an integrated circuit according to another embodiment is shown in a top plan view and designated by the general reference character 500'. Integrated circuit 500' has the same general structure as FIG. 5A, but shows how a single integrating section 508 situated within a core 506 can provide a reference voltage and/or compensation voltage to multiple circuits (510-0 to 510-3) situated within a periphery 504.

Referring to FIG. 5C, an integrated circuit arrangement according to yet another embodiment is shown in a top plan view. FIG. 5C represents how a reference voltage and/or compensation voltage generated by an integrating section 508 can be provided to an output (e.g., bond pad) 514. Such an output 514 can provide a reference voltage and/or compensation voltage to another integrated circuit 550.

The other integrated circuit 550 can receive a reference voltage and/or compensation voltage at an input 552. Such a voltage can then be provided to an input circuit 554 of the other device.

Figure 6B:
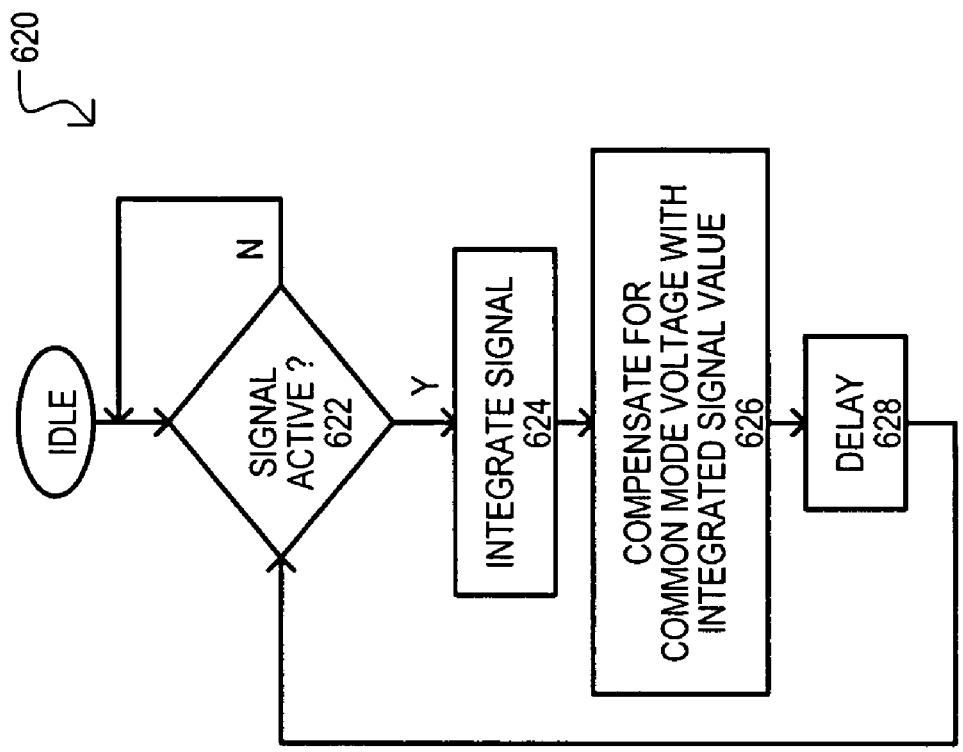
FIGS. 6A and 6B are flow diagrams showing methods according to embodiments of the present invention.
Figure 6A:
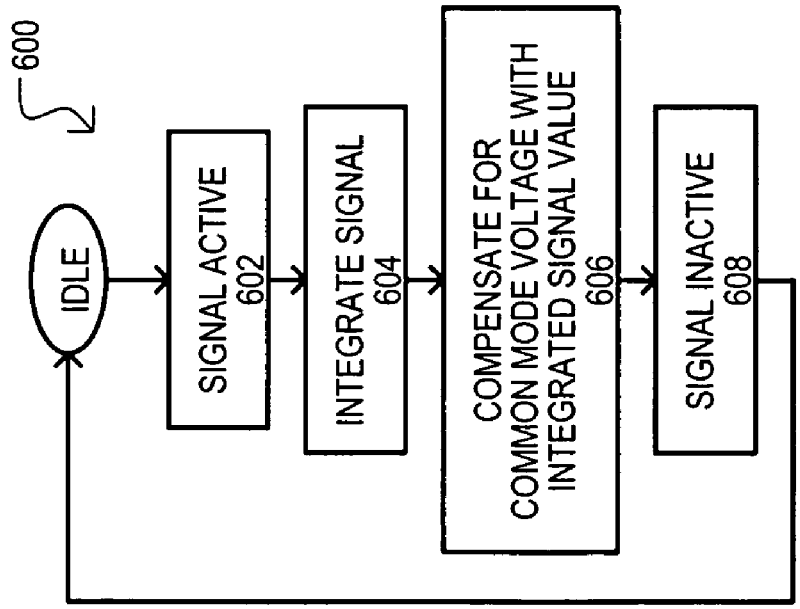
Figures 7A, 7B:
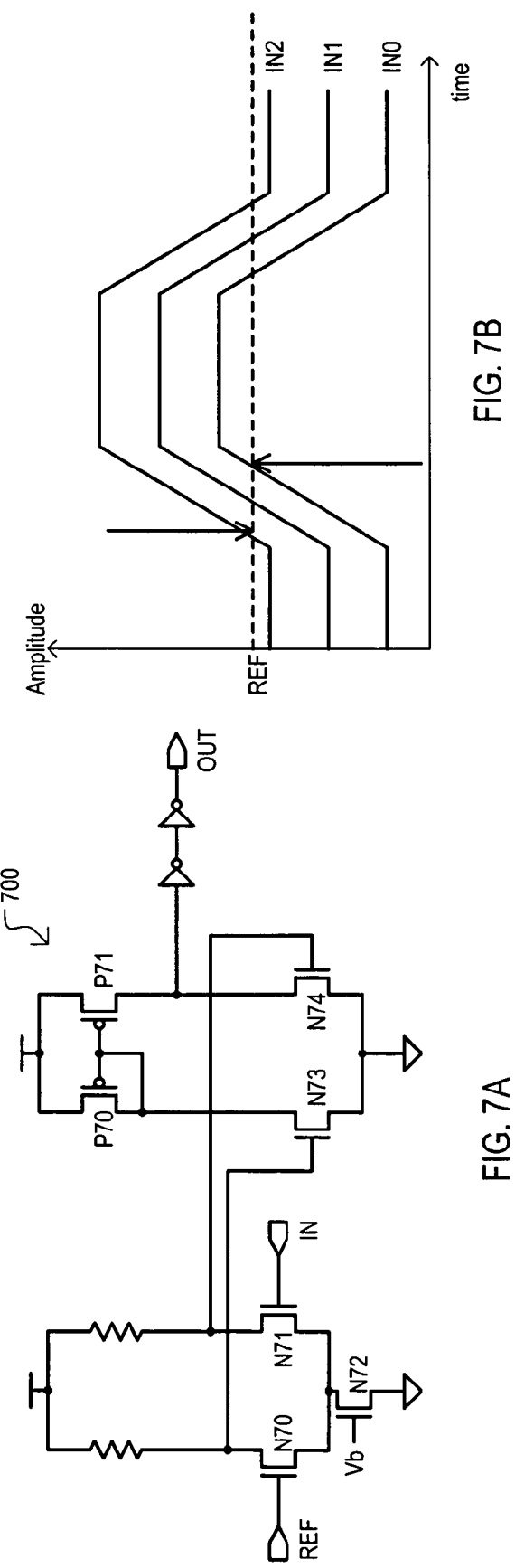
FIG. 7A is a schematic diagram of a conventional single ended input circuit.
FIG. 7B is a timing diagram showing the effects of different signal common mode voltage levels with respect to a reference voltage for a conventional input circuit.

Referring now to FIG. 6A, a method according to an embodiment of the present invention is set forth in flow diagram and designated by the general reference character 600. A method 600 can include determining when an input signal is active (step 602). Such a signal may then be integrated (step 604) and such an integrated signal value can be used to compensate for a common mode voltage (step 606). Steps 604 and 606 may include generating a reference voltage (e.g., as described with reference to FIGS. 1A/1B) and/or generating a compensation voltage (e.g., as described with reference to FIG. 2). Once a signal is inactive, the method can return to waiting until the signal is active (step 608).

Referring now to FIG. 6B, another method according to an embodiment of the present invention is set forth in flow diagram and designated by the general reference character 620. A method 620 can include determining when an input signal is active (step 622). If such a signal is inactive, the method can return to monitoring signal state.

If such a signal is active, such a signal may then be integrated and used for compensation in the same general fashion as in FIG. 6A (steps 624 and 626).

An integrated signal value can continue to be used to compensate for a common mode voltage over a predetermined delay period (step 628). After such a delay, a method 620 can return to step 622.

In this way, compensation steps can be executed periodically for applications in which a common mode voltage may vary over time.

It is understood that the embodiments of the invention may be practiced in the absence of an element and or step not specifically disclosed. That is, an inventive feature of the invention can be elimination of an element or step.

While the various aspects of the particular embodiments set forth herein have been described in detail, the present invention could be subject to various changes, substitutions, and alterations without departing from the spirit and scope of the invention.

What is claimed is:

1. An input circuit, comprising:
at least one common mode detect and hold (CMDH) section that samples an input signal on an input signal line to generate a reference voltage that includes a signal common mode voltage of the input signal; and
at least one compare circuit that compares the potential on the input signal line to the reference voltage to generate an output signal; wherein
the at least one CMDH section includes
a detect circuit that receives the input signal and generates an output voltage,
an analog-to-digital converter for converting the output voltage into a digital value, and
a digital-to-analog converter (DAC) that converts the digital value into the generated reference voltage, the DAC having an output that couples the reference voltage to the compare circuit and not to the detect circuit.

2. The input circuit of claim 1, further including:
a delay matching circuit coupled between the input signal line and the compare circuit that delays the input signal by an amount equivalent to a delay introduced by the at least one CMDH.

3. The input circuit of claim 1, wherein:
the detect circuit is selected from the group consisting of an integrator circuit and an averaging circuit.

4. The input circuit of claim 1, wherein:
the at least one CMDH section further includes a digital hold circuit that includes storage circuits for storing the digital value.

5. The input circuit of claim 1, further including:
a plurality of N input pins;
at least N compare circuits, one for each input pin; and
a plurality of N CMDH sections, each CMDH section providing a generated reference voltage to one of the N corresponding compare circuits.

6. The input circuit of claim 1, further including:
a plurality of N input pins;
at least N compare circuits, one for each input pin; and
a plurality of M signal CMDH sections, where M<N, at least one of the CMDH sections providing a generated reference voltage to a plurality of the N compare circuits.

7. The input circuit of claim 1, further including:
an integrated circuit substrate having a core area surrounded by a periphery area;
a plurality of N compare circuits formed in the periphery area; and
at least one CMDH section formed in the core area that provides a generated reference voltage to each of the plurality of the N compare circuits.

8. The input circuit of claim 1, further including:
a first integrated circuit (IC) substrate having core area surrounded by a periphery area;
a plurality of N compare circuits formed in the periphery area of the first IC substrate;
at least one CMDH section formed in the core area of the first IC substrate that provides a generated reference voltage to each of the plurality of the N compare circuits and to a reference output formed in the periphery of the first IC substrate;
a second IC substrate having core area surrounded by a periphery area;
at least one second device compare circuit formed in the periphery area of the second IC substrate; and
at least one reference input formed in the periphery area of the second IC substrate and coupled to the reference output that provides the reference voltage to the at least one second device compare circuit.

* * * * *